United States Patent
El-Sharawy et al.

(10) Patent No.: US 6,301,147 B1
(45) Date of Patent: Oct. 9, 2001

(54) ELECTRONIC SEMICONDUCTOR CIRCUIT WHICH INCLUDES A TUNNEL DIODE

(75) Inventors: El-Badawy Amien El-Sharawy, Gilbert, AZ (US); Majid M. Hashemi, San Jose, CA (US)

(73) Assignee: National Scientific Corporation, Phoenix, AZ (US)

( * ) Notice: Subject to any disclaimer, the term of this patent is extended or adjusted under 35 U.S.C. 154(b) by 0 days.

(21) Appl. No.: 09/520,081

(22) Filed: Mar. 8, 2000

Related U.S. Application Data

(63) Continuation-in-part of application No. 08/991,966, filed on Dec. 17, 1997.

(51) Int. Cl.⁷ .................................................. G11C 11/00
(52) U.S. Cl. ......................... 365/154; 365/174; 365/175; 365/188
(58) Field of Search .................................. 365/154, 174, 365/175, 188, 189.01

(56) References Cited

U.S. PATENT DOCUMENTS

| | | | |
|---|---|---|---|
| 4,360,897 | * 11/1982 | Lehovec | 365/159 |
| 4,835,458 | 5/1989 | Kim | 324/73 R |
| 4,899,317 | 2/1990 | Hoekstra et al. | 365/203 |
| 4,901,279 | 2/1990 | Plass | 365/154 |
| 4,995,000 | 2/1991 | Terrell | 365/154 |
| 4,995,001 | 2/1991 | Dawson et al. | 365/154 |
| 5,032,891 | 7/1991 | Takagi et al. | 357/41 |
| 5,047,985 | 9/1991 | Miyaji | 365/203 |
| 5,222,039 | 6/1993 | Vinal | 365/156 |
| 5,361,232 | 11/1994 | Petschauer et al. | 365/201 |
| 5,388,068 | * 2/1995 | Ghoshal et al. | 365/162 |
| 5,487,037 | 1/1996 | Lee | 368/189.11 |
| 5,526,304 | 6/1996 | Kawamura | 365/154 |
| 5,593,922 | 1/1997 | Liaw et al. | 437/195 |
| 5,629,546 | 5/1997 | Wu et al. | 257/368 |
| 5,684,737 | 11/1997 | Wang et al. | 365/175 |
| 5,724,292 | 3/1998 | Wada | 365/207 |
| 5,745,407 | 4/1998 | Levy et al. | 365/159 |
| 5,751,630 | 5/1998 | Roberts | 365/154 |
| 5,757,696 | 5/1998 | Matsuo et al. | 365/185.07 |
| 5,771,190 | 6/1998 | Okamura | 365/154 |
| 5,780,906 | 7/1998 | Wu et al. | 257/368 |
| 5,986,923 | 11/1999 | Zhang et al. | 365/154 |
| 6,028,787 | * 2/2000 | Sansbury et al. | 365/185.01 |
| 6,061,268 | * 5/2000 | Kuo et al. | 365/156 |
| 6,067,247 | * 5/2000 | Grossner et al. | 365/154 |
| 6,104,631 | * 8/2000 | El-Sharawy et al. | 365/154 |
| 6,208,555 | * 3/2001 | Noble | 365/159 |

FOREIGN PATENT DOCUMENTS 405315571A 11/1993 (JP).
406085206A 3/1994 (JP).

* cited by examiner

*Primary Examiner*—Viet Q. Nguyen
(74) *Attorney, Agent, or Firm*—Lowell W. Gresham, Esq.; Jordan M. Meschkow, Esq.; Meschkow & Gresham, P.L.C.

(57) ABSTRACT

A static RAM memory cell (30) uses cross-coupled enhancement mode, N-channel MOS drive transistors (36) to form a bistable flip-flop. A load circuit (34) couples between I/O ports (40) of the drive transistors (36) and Vcc. For each drive transistor (36), the load circuit includes a depletion mode, N-channel MOS load transistor (54) and a forward biased tunnel diode (32). The drain and gate of the load transistor (54) couple across the anode and cathode of the tunnel diode (32) so that the forward voltage ($V_f$) of the tunnel diode (32) controls the $V_{gs}$ transfer curve (56) of the load transistor. The tunnel diode (32) may be formed at a junction between a mono-crystalline silicon layer (88) at a region (98, 100) which also serves as a source or drain of a transistor (36, 54) and a poly-crystalline silicon layer (106). The poly-crystalline silicon layer (106) also serves as a non-metallic, conductive interconnection (55) to save space.

22 Claims, 3 Drawing Sheets

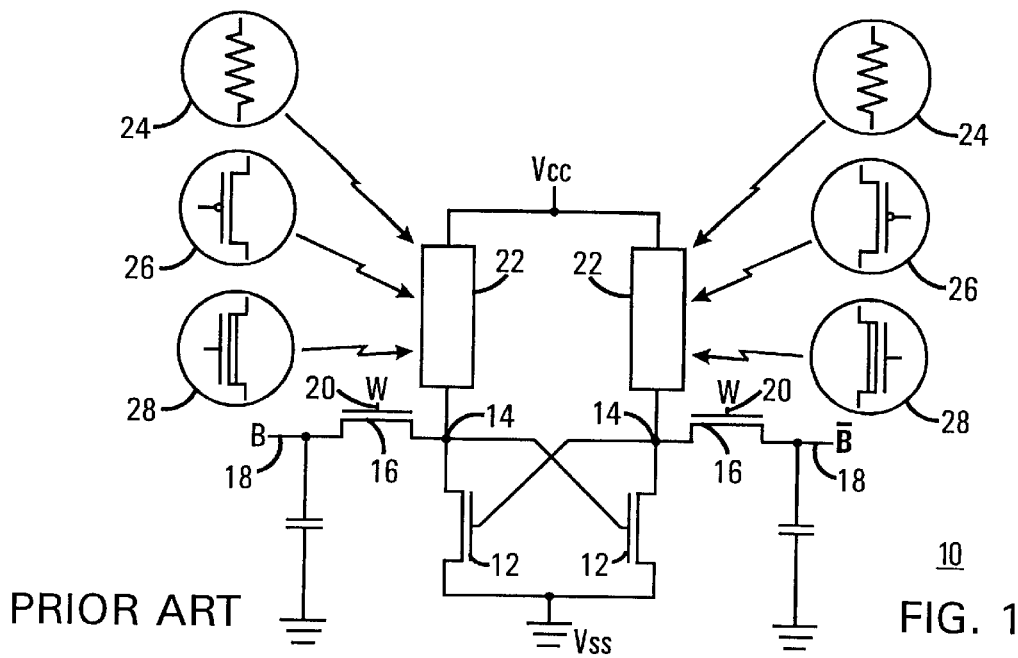
PRIOR ART FIG. 1
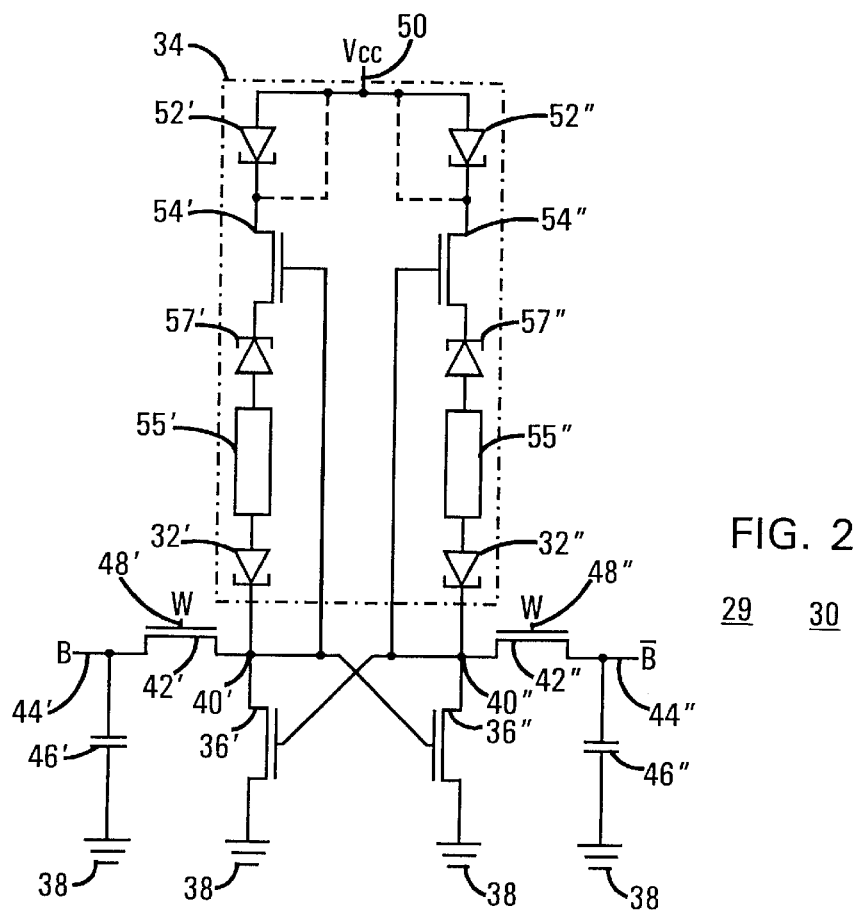
FIG. 2

ELECTRONIC SEMICONDUCTOR CIRCUIT WHICH INCLUDES A TUNNEL DIODE

RELATED PATENTS

The present invention is a Continuation-In-Part of "Static Memory Cell With Load Circuit Using A Tunnel Diode" by Drs. El-Badawy Amien El-Sharawy and Majid M. Hashemi, Ser. No. 08/991,966, filed on Dec. 17, 1997, which is incorporated herein by reference.

TECHNICAL FIELD OF THE INVENTION

The present invention relates generally to electronic semiconductor circuits which include tunnel diodes.

BACKGROUND OF THE INVENTION

Semiconductor manufacturers have continuously faced the problems of space, power and cost. Semiconductors which can be manufactured to require less semiconductor die area, use less power, and cost less are usually more desirable than otherwise equivalent semiconductors which require more die area, use more power, and/or are more expensive.

While these problems are experienced across a broad range of semiconductor products, they are acutely felt in connection with the manufacture of static semiconductor random access memory (RAM) devices. Static semiconductor RAM includes a multiplicity of memory cells, wherein each memory cell stores a single bit of data so long as the RAM device remains energized. Static memory differs from dynamic memory in that data stored in the static memory remains valid without the need for refreshing. A continuing need exists for memory cells that can be implemented in smaller semiconductor die area, consume less power, and are inexpensive. Smaller memory cells lead to semiconductor memory circuits which are capable of storing more data and are often faster devices. However, shrinking a memory cell without impairing stability, speed, yield or power consumption parameters is a difficult task.

FIG. 1 shows a schematic diagram of conventional variations of a static RAM (SRAM) cell. A basic memory cell 10 includes cross-coupled drivers 12. Each driver 12 has an I/O port 14, and drivers 12 together form a bistable storage element that stores a single bit of data. Pass transistors 16 couple I/O ports 14 to bit (B) and bit-bar ($\overline{B}$) lines 18 and word lines (W) 20. Drivers 12 couple to Vss, and loads 22 couple between Vcc and drivers 12. Conventional variations in memory cell 10 differ from one another in their configurations for loads 22.

One prior art memory cell 10 uses resistors 24 for loads 22. When resistors 24 are used for loads 22, memory cell 10 is referred to as a four-transistor memory cell. Lower valued resistors 24 are desirable in order to improve yield, reliability, and area requirements. In addition, lower valued resistors 24 promote stability and greater immunity to noise when the drive transistors 12 for which they are loads are in "off" states. Unfortunately, higher valued resistors are desirable to reduce standby power consumption and to improve the speed of operation. Moreover, higher valued resistors promote stability and greater noise immunity when the drive transistors 12 for which they are loads are in "on" states.

No single resistor value of a four-transistor memory cell promotes stability and noise immunity for both states of drive transistors 12. Further, as cell size shrinks, reduced power consumption becomes more important for purposes of heat dissipation because a given amount of power is dissipated over the cell's die area. Accordingly, the use of resistive loads in memory cell 10 leads to undesirably high standby power consumption and to worsened stability, speed, yield and/or reliability characteristics as cell size shrinks. Yield problems translate into increased costs.

Another prior art memory cell 10 uses P-channel transistors 26 for loads 22. When P-channel or other transistors are used for loads 22, memory cell 10 is referred to as a six-transistor memory cell. P-channel transistors 26 solve many of the problems associated with resistors 24. P-channel transistor 26 memory cell implementations consume a moderately low amount of power and can be manufactured reliably. However, P-channel transistors 26 require an undesirably large die area. A P-channel transistor typically requires the formation of an N-well diffusion into the substrate in which the P-type drain and source diffusions are formed, and this N-well diffusion occupies a large area. Moreover, the channel itself is typically larger than in a corresponding N-channel transistor due to lower hole mobility for the P-channel device.

In addition, P-channel loads 26 cause the memory cells to experience current spikes for brief instants when both drive and load transistors are at least partially in their "on" states. The current spikes contribute to an undesirable package resonance effect and slow memory cell access, particularly for write operations. Accordingly, while P-channel transistor loads 26 work well for many purposes, P-channel transistors 26 are too large for use in small memory cells and experience excessive current spikes which slow operation and increase power consumption above theoretical levels.

Another prior art memory cell 10 uses depletion mode, N-channel transistors 28 for loads 22. Depletion mode, N-channel transistors 28 are smaller than P-channel transistors 26, but experience problems similar to those experienced by resistors 24. In particular, depletion mode transistors 28 are characterized by high power in their "off" state. Processes which minimize this power consumption parameter cause yield problems. Moreover, a body effect causes a depletion mode transistor to continuously, rather than discretely or distinctly, transition between "on" and "off" states. This continuous transition feature leads to undesirable switching noise, current spikes, and slow access times.

Another prior art memory cell (not shown) uses a tunnel diode as a storage element. A tunnel diode has two distinct operating regions. A first operating region occurs at a low forward voltage, typically less than 0.1 volts. A second operating region occurs at a higher forward voltage, typically greater than 0.6 volts. The region between these two operating regions (i.e. typically around 0.1–0.6 volts) is an unstable region in which the device exhibits a negative resistance. A tunnel diode acts as a storage element by distinctly operating in either the first region or the second region. While a tunnel diode storage element exhibits desirable size and power characteristics, it is not a stable device. In other words, the tunnel diode storage element too easily switches to its other region of operation when a device incorporating such elements experiences a range of temperatures and read-write operations over time, as occurs in normal memory circuits. Because of stability problems, memory cells using tunnel diodes as storage elements have not proven themselves to be commercially viable.

Another problem with memory cells and other electronic semiconductor circuits relates to the excessive area requirements for interconnections between circuit components. For example, an interconnection connects load 22 with driver 12 in the prior art circuit of FIG. 1. Other interconnections connect driver 12 with other components of the circuit, and still other interconnections connect still other components together. In a typical scenario, a contact area is provided in a top active semiconductor layer for respective nodes of each component. An insulating layer overlies the active semiconductor layers, but has vias or holes down to the contact areas. Metallization is applied over the insulating layer and into the vias, then etched so that the remaining metallization interconnects the electronic components.

An undesirable amount of circuit area is often consumed to provide contact areas. The contact areas usually need to be relatively large because the subsequent processing steps of forming vias and applying metallization may not precisely align axes of vias with centers of contact areas and require the bottom of vias to exhibit some minimum area to insure reliable and adequate fill-in by the metallization. Accordingly, the use of contact areas, vias and metallization to form interconnections consumes an undesirable amount of circuit area.

Furthermore, in order to prevent shorting to other interconnects, semiconductor devices should observe a minimum metal-to-metal spacing. In modern semiconductor processes, this metal-to-metal spacing is relatively large compared to other spacing requirements. Accordingly, the more a circuit includes nodes interconnected through metallization, the larger the circuit becomes due to the need to meet metal-to-metal spacing minimums which prevent the interconnections from shorting.

Electronic circuits which include tunnel diodes are challenging to manufacture. Effective tunnel diodes typically use heavy concentrations of opposing conductivity type dopants on opposing sides of a relatively abrupt semiconductor junction. The high dopant concentration requirements often lead to shallow regions of such doping, and such shallow regions may cause yield problems due to the spiking of metallization through such shallow regions in the vicinity of contact areas. In order to improve junction abruptness, semiconductor manufacturers have often included non-silicon semiconductor materials, such as GaAs, InP, and the like, and used complicated growing equipment and processes to form a resonant tunneling structures. However, such non-silicon semiconductor tunnel diodes are significantly more expensive than those which would result from using more compatible semiconductor materials in active junctions due to the use of expensive materials, complex manufacturing processes and low yields.

SUMMARY OF THE INVENTION

Accordingly, it is an advantage of the present invention that an improved electronic semiconductor circuit which includes a tunnel diode is provided.

Another advantage of the present invention in one embodiment is that a static memory cell is provided that uses a tunnel diode in the memory cell load.

Another advantage of the present invention is that a static memory cell or other electronic circuit that includes a tunnel diode is implemented in a small area.

Another advantage of the present invention is that a high speed, high density static memory cell or other electronic circuit is provided.

Another advantage of the present invention in one embodiment is that a static memory cell or other electronic circuit includes a tunnel diode formed by a junction between a mono-crystalline silicon layer and a poly-crystalline silicon layer.

Another advantage of the present invention in one embodiment is that a static memory cell or other electronic circuit includes a tunnel diode formed over a transistor so that no additional semiconductor die area is consumed in forming the tunnel diode.

The above and other advantages of the present invention are carried out in one form by a static memory cell which includes a drive transistor having an input/output (I/O) port. A load transistor has a controlling input and a controlled port. A tunnel diode is coupled in series between the controlled port of the load transistor and the I/O port of the drive transistor. The tunnel diode is formed on the I/O port of the drive transistor.

The above and other advantages of the present invention are carried out in another form by a static memory cell which includes a drive transistor having an input/output (I/O) port formed in a first region of a mono-crystalline silicon layer. A load transistor has a controlled port formed in a second region of the mono-crystalline silicon layer. A conductive poly-crystalline silicon interconnect is formed between the first and second regions of the mono-crystalline silicon layer. The poly-crystalline silicon interconnect is configured to form a forward biased tunnel diode at a junction between the interconnect and the mono-crystalline silicon layer.

The above and other advantages of the present invention are carried out in another form by an electronic semiconductor circuit which includes a tunnel diode. The circuit includes a mono-crystalline silicon layer doped with an impurity of a first conductivity type. A poly-crystalline silicon layer overlies the mono-crystalline silicon layer. The poly-crystalline silicon layer is doped with an impurity of a second conductivity type. Effective concentrations of the first conductivity type and the second conductivity type dopants are respectively included in the mono-crystalline and poly-crystalline silicon layers so that tunneling results.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a schematic diagram of prior art variations to a memory cell;

FIG. 2 shows a schematic diagram of an electronic circuit in the form of a memory cell that uses a tunnel diode in a load circuit in accordance with the teaching of the present invention;

DETAILED DESCRIPTION OF THE PREFERRED EMBODIMENTS

Figure 3:
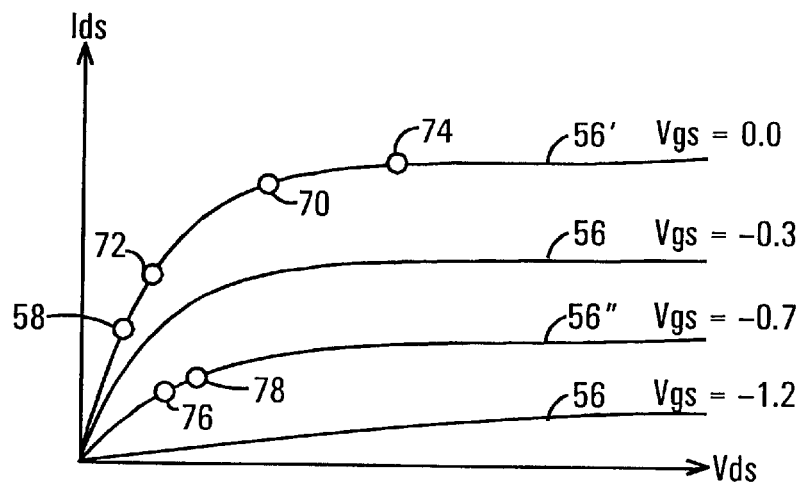
FIG. 3 shows a family of transfer curves that depict an exemplary operation of a depletion mode transistor portion of a memory cell load circuit and various operating points realized on these curves as a memory cell drive transistor switches from "off" to "on" states.

FIG. 2 shows a schematic diagram of an electronic circuit 29 in the form of a memory cell 30 that uses a tunnel diode 32 in a memory cell load circuit 34 in accordance with the teaching of the present invention. Memory cell 30 is a symmetrical circuit in which each component has a symmetrical counterpart. In the Figures and this description, the components are distinguished from their counterparts through prime (') and double-prime (") suffixes in their respective reference numbers. Reference numbers used herein without suffixes indicate either a component or its counterpart individually or both components collectively.

Memory cell 30 includes a bi-stable flip-flop formed from drive transistors 36. Drive transistors 36 are desirably enhancement mode, N-channel metal oxide semiconductor (MOS) field effect transistors (FETs). A gate of a drive transistor 36' couples to a drain of a drive transistor 36", and a gate of drive transistor 36" couples to a drain of drive transistor 36'. Sources for each of drive transistors 36 couple to a terminal 38 adapted to receive a lower common potential, referred to herein as Vss or as ground.

The drains of drive transistors 36 serve as input/output (I/O) ports 40 for drive transistors 36. I/O ports 40 of drive transistors 36 respectively couple to first controlled ports of pass transistors 42, and second controlled ports of pass transistors 42 respectively couple to bit lines 44. Bit-bar ($\overline{B}$) line 44" conveys an opposite polarity bit to that conveyed by bit (B) line 44'. Capacitors 46 are illustrated in FIG. 2 as being respectively coupled between bit lines 44 and ground terminal 38 to indicate intrinsic capacitance present in the semiconductor device within which memory cell 30 resides. Capacitors 46 are desirably not lumped elements within this device. Controlling inputs of pass transistors 42 respectively connect to word lines (W) 48.

Pass transistors 42 are desirably enhancement mode, N-channel metal oxide semiconductor (MOS) field effect transistors (FETs) fabricated using the same conventional semiconductor processing techniques used to form drive transistors 36. Accordingly, the controlled ports of pass transistors 42 are sources and drains, and the controlling ports are gates. Bit lines 44 and word lines 48 couple memory cell 30 with other similar memory cells 30 in a manner well known to those skilled in the design and fabrication of SRAM semiconductor devices.

Load circuit 34, shown within dotted lines in FIG. 2, couples to bi-stable flip-flop at I/O ports 40 and to a terminal 50 adapted to receive a higher common potential, referred to herein as Vcc. In particular, Vcc terminal 50 couples to anodes of forward biased smaller tunnel diodes 52' and 52". Cathodes of smaller tunnel diodes 52 respectively couple to first controlled ports of load transistors 54. In an alternate embodiment which is discussed in more detail below, smaller tunnel diodes 52 are omitted, and Vcc terminal 50 directly couples to the first controlled ports of both load transistors 54, as indicated by dotted lines in FIG. 2.

Second controlled ports of load transistors 54 respectively couple to cathodes of reverse biased tunnel diodes 57. Anodes of reverse biased tunnel diodes 57 respectively couple to anodes of forward biased larger tunnel diodes 32 through interconnections 55, discussed in more detail below. Reverse biased tunnel diodes 57 are used as ohmic contacts between interconnections 55 and controlled ports of load transistors 54. Reverse biased tunnel diodes 57 exhibit a very low resistance transfer characteristic which is useful in making a connection between interconnections 55 and the controlled ports of load transistors 54 using only a small amount of semiconductor die area. Cathodes of larger tunnel diodes 32 and controlling inputs of load transistors 54 respectively couple to I/O ports 40. Accordingly, larger tunnel diodes 32 are forward biased and coupled in series between controlled ports of load transistors 54 and I/O ports 40 of drive transistors 36.

Load transistors 54 are desirably depletion mode, N-channel metal oxide semiconductor (MOS) field effect transistors (FETs). The first controlled ports of load transistors 54 are drains, the second controlled ports of load transistors 54 are sources, and the controlling inputs of load transistors 54 are gates. Since load transistors 54 are preferably N-channel devices, no N-well diffusions are required, and they can be fabricated using substantially an equivalent small amount of semiconductor die area per transistor as that required for drive and pass transistors 36 and 42.

Tunnel diodes 32, 52 and 57 are also fabricated using semiconductor processing techniques compatible with the fabrication of MOS transistors 36, 42, and 54. One preferred processing technique is discussed in more detail below in connection with FIGS. 6–11.

In the preferred embodiments, smaller tunnel diodes 52 are typically 70–90% of the size of larger tunnel diodes 32. This causes the forward peak current parameter ($I_{p0}$) of smaller tunnel diodes 52 to be lower than the forward peak current parameter ($I_{p1}$) of larger tunnel diodes 32, as is more fully discussed below in connection with FIG. 4.

FIG. 3 shows a family of transfer curves 56 that depict an exemplary operation of depletion mode load transistors 54 at various operating points realized on curves 56 as corresponding enhancement mode drive transistors 36 switch from "off" to "on" states. Referring to FIGS. 2 and 3, the below-presented discussion may be viewed as referring to either one circuit "chain" which includes smaller tunnel diode 52', load transistor 54', larger tunnel diode 32', and drive transistor 36' or to another circuit chain that includes smaller tunnel diode 52", load transistor 54", larger tunnel diode 32", and drive transistor 36". When drive transistor 36' is switching from "off" to "on" states, the other drive transistor 36" is switching from "on" to "off" states, and vice-versa. Accordingly, the below presented discussion omits reference number suffixes which distinguish one chain from the other to describe the operation of both chains, depending upon the state of memory cell 30.

Curves 56 depict an exemplary set of transfer characteristics for depletion mode load transistor 54 at various gate-to-source voltages ($V_{gs}$). Starting at an initial steady state condition where drive transistor 36 is "off", I/O port 40 is at a high voltage, and the voltage across this chain of load circuit 34 is low. Accordingly, both $V_{gs}$ and $V_{ds}$ are near 0 volts and a transfer curve 56' describes the operation of load transistor 54. In particular, load transistor 54 operates around a point 58 on curve 56'. The low $V_{gs}$ and $V_{ds}$ values cause load transistor 54 to draw only a small amount of current ($I_{ds}$).

Figure 4:
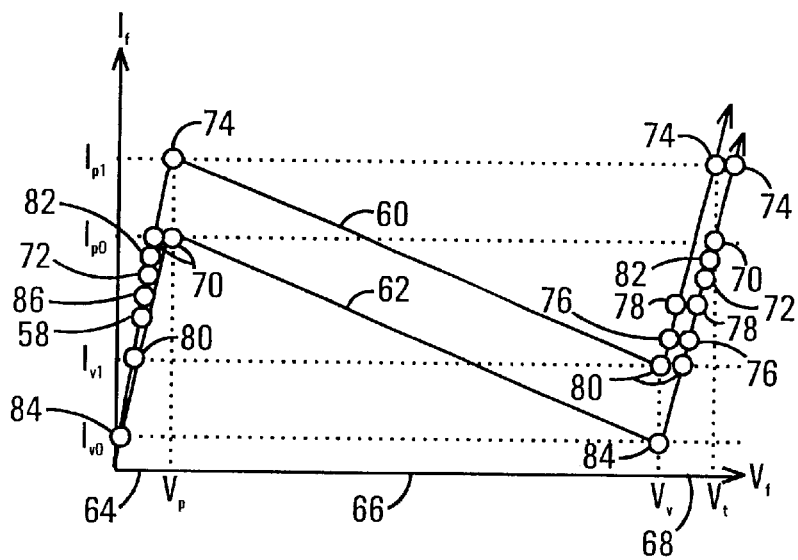
FIG. 4 shows transfer curves that depict exemplary operation of different tunnel diodes included in the load circuit.

FIG. 4 shows transfer curves 60 and 62 that depict exemplary characteristics of tunnel diodes 32 and 52, respectively. Tunnel diodes 57 are reverse biased and have little influence over the operation. Operating point 58 is also depicted on curves 60 and 62. In this steady state condition, a little current flows through tunnel diodes 32 and 52, and very little forward voltage ($V_f$) is developed across tunnel diodes 32 and 52. The low $I_{ds}$ and low $V_{ds}$ and $V_f$ values that characterize this steady state condition mean that only a very small amount of standby power is consumed.

Transfer curves 60 and 62 show three distinct regions in which tunnel diodes 32 and 52 operate. A region 64 occurs when tunnel diode $V_f$ is between 0 and a peak voltage ($V_p$) and forward current ($I_f$) is between 0 and the peak forward current ($I_p$). In silicon tunnel diodes, $V_p$ typically occurs at around 0.065 V. Operating point 58 resides in region 64. A region 66 occurs when tunnel diode $V_f$ is between $V_p$ and a valley voltage ($V_v$). Region 66 is an unstable negative differential resistance region in which $I_f$ decreases to a low valley current ($I_v$) as $V_f$ increases to $V_v$. In silicon tunnel diodes, $V_v$ typically occurs at around 0.42 V. A region 68 occurs when tunnel diode $V_f$ is greater than $V_v$. In region 68 $I_f$ increases with increasing $V_f$. As the $I_f$ conducted through tunnel diodes 32 and 52 increases from zero, $V_f$ instantly snaps or steps from $V_p$ in region 64 to a transfer voltage ($V_t$) in region 68 when $I_f$ reaches $I_p$. In silicon tunnel diodes, $V_t$ typically occurs at around 0.70 V. At $V_t$, the tunnel diode conducts the same amount of current (i.e. $I_p$) it was conducting before the snap. This snap or step in $V_f$ results from a tunneling phenomena that occurs at roughly the speed of light. Accordingly, the snap need require only a small fraction of a nanosecond to complete.

Referring to FIGS. 2–4, when drive transistor 36 switches from its "off" state to its "on" state, the voltage at I/O port 40 drops toward Vss causing the voltage across load circuit 34 to increase. As the voltage across load circuit 34 increases, the operating point of load transistor 54 moves upward along curve 56', and load transistor 54 draws more current. This increasing current causes tunnel diodes 32 and 52 to approach their peak forward current values $I_p$. At an operating point 70 on transfer curve 56', the current reaches $I_p$ for smaller tunnel diode 52, referenced as $I_{p0}$ in FIG. 4.

At $I_{p0}$, the voltage across smaller tunnel diode 52 snaps from $V_p$ to $V_t$, causing $V_{ds}$ for load transistor 54 to instantly drop by approximately 0.6 V and current $I_{ds}$ to decrease. Accordingly, immediately after smaller tunnel diode 52 snaps to $V_t$, operating point 72 is realized. Operating point 72 resides in region 68 of smaller tunnel diode curve 62 and in region 64 of larger tunnel diode curve 60.

As the voltage at I/O port 40 drops even further toward Vss, $V_{ds}$ and $I_{ds}$ again both increase along curve 56'. Eventually, $I_{ds}$ reaches $I_p$ for larger tunnel diode 32, referenced as $I_{p1}$, in FIG. 4, and an operating point 74 is realized. At $I_{p1}$, the voltage across larger tunnel diode 32 snaps from $V_p$ to $V_t$ causing $V_{ds}$ for load transistor 54 to again drop by approximately 0.6 V and causing $V_{gs}$ for load transistor 54 to drop to approximately −0.7 V. This drop in $V_{gs}$ to around −0.7 V instantly causes load transistor 54 to exhibit transfer characteristics similar to those identified by curve 56" in FIG. 3. $I_{ds}$ is lowered by the transfer characteristics of curve 56" relative to transfer characteristics of curve 56', and the drop in $V_{ds}$ of load transistor 54 causes further lowering of $I_{ds}$ along curve 56". Accordingly, immediately after larger tunnel diode 32 snaps to $V_t$, an operating point 76 is realized.

From operating point 76, $V_{ds}$ and $I_{ds}$ both increase along curve 56". Desirably, Vcc is selected in cooperation with the characteristics of transistors 36 and 54 so that drive transistor 36 goes into saturation soon after operating point 76 is reached. Accordingly, an operating point 78 is realized at a steady state condition where drive transistor 36 is in its "on" state. At operating point 78, little standby power is consumed because little current flows through this chain of load circuit 34.

At steady state operating point 78, load transistor 54 operates on curve 56" and tunnel diodes 32 and 52 both operate in their third regions 68. In contrast, at steady state operating point 58 load transistor 54 operates on curve 56' and tunnel diodes 32 and 52 both operate in their first regions 64. Consequently, load circuit 34 exhibits a relatively high dynamic resistance for operating point 78 and a relatively low dynamic resistance for operating point 58. Dynamic resistance refers to the resistance exhibited at an operating point from small changes in current or voltage.

This difference in dynamic resistance at the steady state operating points promotes stability. The lower dynamic resistance of operating point 58, where I/O port 40 exhibits a high level and drive transistor 36 is "off", causes a given current spike to have a smaller influence on the voltage at I/O port 40. The higher dynamic resistance of operating point 78, where I/O port 40 exhibits a low level and drive transistor 36 is in saturation, again causes a given current spike to have a smaller influence on the voltage at I/O port 40.

Certain design considerations are desirably met in the fabrication of load transistor 54 and tunnel diodes 32 and 52. As discussed above, when smaller tunnel diode 52 snaps to move operation from point 70 in region 64 to point 72 in region 68, $I_{ds}$ decreases due to a drop in $V_{ds}$ across load transistor 54. This causes $I_f$ through smaller tunnel diode 52 to decrease toward a valley current ($I_{v0}$). Desirably, the gain of load transistor 54 is sufficiently low that operating point 72 does not reach $I_{v0}$. Further decrease in current below $I_{v0}$ would cause smaller tunnel diode 52 to snap to region 64 and an undesirable oscillating condition could be established. Those skilled in the art of semiconductor design and fabrication can easily insure that the gain of transistor 54 is not so high as to risk oscillation.

Likewise, when larger tunnel diode 32 snaps to move operation from point 74 in region 64 to point 76 in region 68, $I_{ds}$ again decreases due to both the drop in $V_{gs}$ across load transistor 54 and a drop in $V_{ds}$ across load transistor 54. This causes $I_f$ through larger tunnel diode 32 to decrease toward a valley current ($I_{v1}$). Desirably, the gain of load transistor 54 is sufficiently low that operating point 76 does not reach $I_{v1}$. Further decrease in current below $I_{v1}$ would cause larger tunnel diode 32 to snap to region 64 and an undesirable oscillating condition could be established. Those skilled in the art of semiconductor design and fabrication can easily insure that the gain of transistor 54 is not so high as to risk oscillation.

These design considerations provide the basis for including smaller tunnel diode 52 in load circuit 34. The snapping of smaller tunnel diode 52 and the resultant lowering of $V_{ds}$ for load transistor 54 reduces the effective gain of transistor 54 just before larger diode 32 snaps. Accordingly, this reduces the likelihood of operating point 76 reaching $I_v$ in region 68. While smaller tunnel diode 52 improves the robustness of memory cell 30 for a variety of operating conditions, it is not a necessity. Smaller tunnel diode 52 may be omitted where good processing control of the gain for load transistor 54 can be assured and where an application, such as a battery powered application, may not have sufficient Vcc to tolerate the voltage drop across smaller tunnel diode 52.

Figure 5:
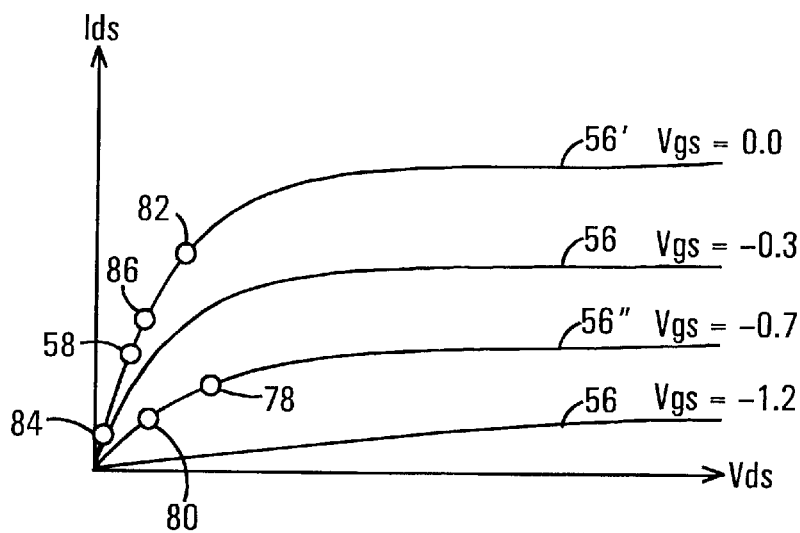
FIG. 5 shows the family of transfer curves from FIG. 3 with various operating points realized as the memory cell drive transistor switches from "on" to "off" states.

FIG. 5 shows the same transfer curves 56 for load transistor 54 as those illustrated in FIG. 3. However, FIG. 5 depicts various operating points that are realized as drive transistor 36 switches from its "on" condition to its "off" condition. Operating point 78 reflects the steady state "on" condition for drive transistor 36.

Referring to FIGS. 2, 4, and 5, when drive transistor 36 switches from its "on" state to its "off" state, the voltage at I/O port 40 is pulled up toward Vss causing the voltage across this chain of load circuit 34 to decrease. As the voltage across load circuit 34 decreases, the operating point of load transistor 54 moves downward along curve 56", and load transistor 54 draws less current. This decreasing current causes tunnel diodes 32 and 52 to approach their $I_v$ values. At an operating point 80, the current reaches $I_{v1}$ for larger tunnel diode 32.

At $I_{v1}$, the voltage across larger tunnel diode 32 snaps from $V_v$ to $V_p$, causing $V_{ds}$ and $V_{gs}$ for load transistor 54 to instantly increase by approximately 0.4 V. This snap instantly increases $V_{gs}$ to around 0.0 V and causes load transistor 54 to exhibit transfer characteristics approximately identified by curve 56'. $I_{ds}$ increases due to the transfer characteristics of curve 56' versus the characteristics of curve 56", and the increase in $V_{ds}$ of load transistor 54 causes a further increase in $I_{ds}$ along curve 56'. Accordingly, immediately after larger tunnel diode 32 snaps to $V_p$, an operating point 82 is realized.

As the voltage at I/O port 40 continues to increase further toward Vcc, $V_{ds}$ and $I_{ds}$ both decrease along curve 56'. Eventually, $I_{ds}$ reaches $I_{v0}$ for smaller tunnel diode 52, and an operating point 84 is realized. At $I_{v0}$, the voltage across smaller tunnel diode 52 snaps from $V_v$ to $V_p$ causing $V_{ds}$ and $V_{gs}$ for load transistor 54 to again increase by approximately 0.4 V. The instant increase in $V_{ds}$ of load transistor 54 causes an increase in $I_{ds}$ along curve 56'. Accordingly, immediately after smaller tunnel diode 52 snaps to $V_p$, an operating point 86 is realized.

From operating point 86, $V_{ds}$ and $I_{ds}$ both decrease along curve 56' as the voltage of I/O port 40 continues to rise. Accordingly, operating point 58 is realized at a steady state condition where drive transistor 36 is in its "off" state.

As should be apparent from the above-presented discussion, a large portion of the voltage swings that occur while I/O port 40 changes from high to low and low to high states occurs in response to tunnel diode snaps. These snapping events occur extremely fast. Consequently, I/O ports 40 change states extremely fast. Because these state changes occur so quickly, little power is actually consumed during the high current transitions between these states.

Moreover, because these state changes occur so quickly, little switching noise results. Switching noise occurs when both drive and load transistors 36 and 54 are conducting for an instant during the transition between states. Since the transition between states happens so quickly, this instant of both transistors conducting is exceedingly brief, and an opportunity for a current spike to build is very limited. The small amount of switching noise generated by memory cell 30 leads to reduced package resonance and an ability to perform write operations quickly.

FIGS. 6–11 illustrate a semiconductor manufacturing process useful in producing one embodiment of memory cell 30. In particular, FIGS. 6–11 illustrate a cross sectional schematic view of a selected portion of memory cell 30 during different stages in this process. The selected portion depicted in FIGS. 6–11 includes, from a single circuit chain of memory cell 30, a load transistor 54, reverse biased diode 57, interconnect 55, larger forward biased tunnel diode 32, and drive transistor 36.

Figure 6:
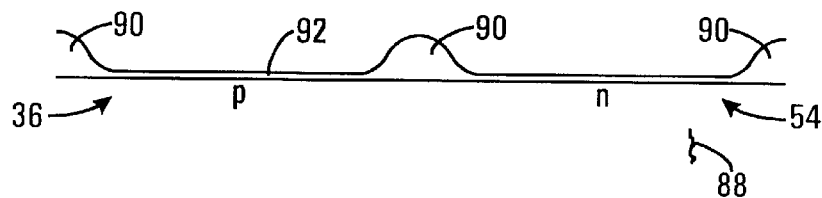
FIG. 6 shows a cross sectional schematic view of a selected portion of the memory cell which includes a tunnel diode during a first manufacturing stage.

Referring specifically to FIG. 6, a mono-crystalline silicon wafer or other substrate 88 is obtained in a first stage, and any field oxide 90 thereon is removed in the areas where drive and load transistors 36 and 54 are to be formed. A small amount of field oxide 90 may be left between drive and load transistors 36 and 54, but drive and load transistors 36 and 54 are desirably placed as close together as reasonably possible to minimize the area consumed by memory cell 30. Since both of transistors 54 and 36 are NMOS transistors, they may be placed closer together than would be permissible if not of the same type.

In addition, a gate oxide 92 is formed in the areas of drive and load transistors 36 and 54, and background implantation is performed for threshold adjustment purposes. For example, in the region of drive transistor 36, a P-type conductivity dopant may be implanted at a moderate to low concentration to ensure enhancement mode operation. In the region of load transistor 54, a N-type conductivity dopant may be implanted at a low concentration to ensure depletion mode operation.

Figure 7:
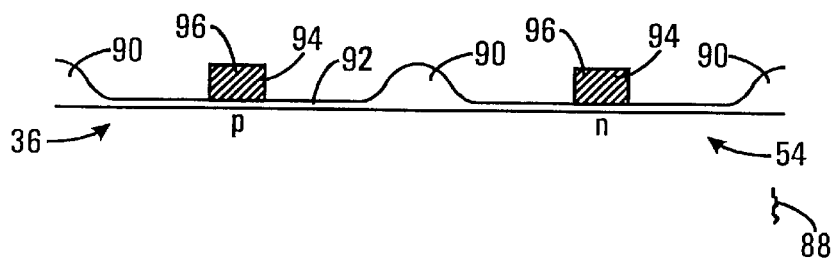
FIG. 7 shows a cross sectional schematic view of the selected portion of the memory cell during a second manufacturing stage.

FIG. 7 illustrates a second stage of the manufacturing process which follows the first stage discussed above in connection with FIG. 6. In this second stage, poly-crystalline silicon layer 94 is deposited using conventional techniques, such as chemical vapor deposition, to a thickness which will be effective in the formation of gates 96 for transistors 36 and 54. In addition, N type conductivity dopant may be applied at this stage using conventional techniques, such as implantation or concurrent with deposition, so that gates 96 exhibit the proper polarity of conductivity, and an etching operation is performed to remove portions of poly-crystalline silicon layer 94 not needed in connection with gates 96.

Figure 8:
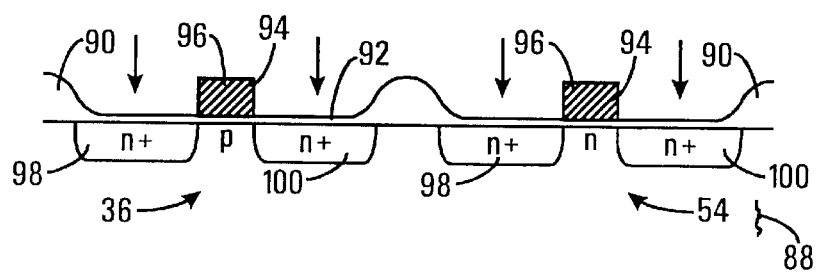
FIG. 8 shows a cross sectional schematic view of the selected portion of the memory cell during a third manufacturing stage.

FIG. 8 illustrates a third stage which follows the gate poly deposition-and-etch stage discussed above in connection with FIG. 7. In this third stage, source regions 98 and drain regions 100 are implanted using a suitable N type dopant. The depths of source and drain regions 98 and 100 desirably exhibit concentrations of dopant effective for the formation of sources and drains. However, as a minimum, the shallower sections of source and drain regions 98 and 100 are desirably formed to exhibit the higher concentrations of dopant effective for the formation of tunnel diode junctions. In particular, both sides of the junctions which form tunnel diodes are highly doped in excess of $1 \times 10^{19}$ so as to be considered degenerate semiconductors. Nothing prevents such a high concentration of dopant from also be implanted deeper than is actually necessary for the shallow region at the surface of mono-crystalline silicon substrate 88 which will become an active part of tunnel diodes.

Figure 9:
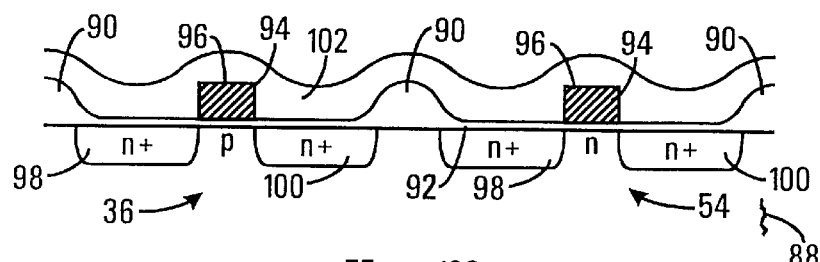
FIG. 9 shows a cross sectional schematic view of the selected portion of the memory cell during a fourth manufacturing stage.

FIG. 9 illustrates a fourth stage which follows the source and drain implantation stage discussed above in connection with FIG. 8. In this fourth stage, a passivation layer 102 is formed over the structure depicted in FIG. 7. Conventional techniques are used, and passivation layer 102 is formed of $SiO_2$.

Figure 10:
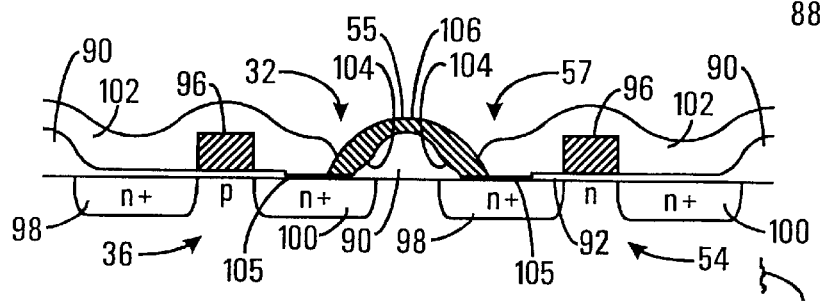
FIG. 10 shows a cross sectional schematic view of the selected portion of the memory cell during a fifth manufacturing stage.

FIG. 10 illustrates a fifth stage which follows the passivation stage discussed above in connection with FIG. 9. In this fifth stage, vias 104 are formed through passivation layer 102 down through gate oxide layer 92, and a poly-crystalline silicon layer 106 is then deposited and degenerately doped with a suitable P-type conductivity dopant so as to be effective in forming tunnel diodes 32 and 57. Poly-crystalline silicon layer 106 may be doped using conventional techniques such as implantation or preferably an in situ technique. Although not illustrated in FIGS. 6–11, tunnel diode 52 (FIG. 2) is formed in a like manner.

After deposition of poly-crystalline silicon layer 106, layer 106 is etched away except overlying vias 104 so that tunnel diodes 32 and 57 are formed and except for the section extending between tunnel diodes 32 and 57, which forms interconnection 55. The heavy doping of layer 106 which causes layer 106 to form a tunneling semiconductor junction with drain 100 of drive transistor 36 and source 98 of load transistor 54 also causes layer 106 to exhibit relatively high conductivity for a non-metallic interconnect layer. Accordingly, interconnection 55 provides electrical conductivity between source 98 of load transistor 54 and tunnel diode 32.

Connection between interconnection 55 and source 98 of load transistor 54 occurs through reverse biased tunnel diode 57. Connection between the cathode of forward biased tunnel diode 32 and drain 100 of drive transistor 36 occurs within the drain 100 beneath an equilibrium depletion layer (not shown) for tunnel diode 32. Accordingly, electrical connection is provided from load transistor 54 to the anode of forward biased tunnel diode 32 without resorting to a metallization layer to provide the electrical connection. Since a metallization layer is not required to make this connection, no enlarged metallization contact area is required. In addition, greater freedom in the placement of other metallization layer traces, discussed below, results because a minimum metal-to-metal spacing need not be observed with respect to interconnection 55. These factors lead to forming memory cell 30 or another electronic circuit using only a small amount of area on a semiconductor die. This small amount of area need not be expanded to accommodate the formation of tunnel diodes 32, 52 and 57 because each of these tunnel diodes is desirably formed on a source or drain of an associated NMOS transistor. Moreover, no contact areas and no additional metal-to-metal spacings are required of the electronic circuit to support the inclusion of tunnel diodes 32, 52 and 57.

In one embodiment, while forming vias 104 in this fifth stage, gate oxide layer 92, which is made of an insulating material such as $SiO_2$, is removed and a thin natural oxide layer 105 is allowed to re-grow in vias 104 over monocrystalline silicon substrate 88. Layer 105 within the junctions of tunnel diodes 32 and 57 is desirably maintained as only a thin layer preferably less than 25 Å thick and more preferably less than 15 Å thick. At this thickness, the electrical influence of layer 105 is not extreme but nevertheless tends to lower the minimum valley currents $I_{v0}$ and $I_{v1}$ (FIG. 4) exhibited by forward biased tunnel diodes 32 and 52 (FIG. 2). Lowering minimum valley currents $I_{v0}$ and $I_{v1}$ causes lower power consumption.

Moreover, layer 105 forms a barrier which impedes diffusion of the heavy concentrations of dopant away from opposing sides of the tunnel diode semiconductor junctions. Consequently, a more abrupt semiconductor junction results and a robust tunneling phenomenon is demonstrated. Another factor which impedes diffusion of the heavy concentrations of dopant away from opposing sides of the tunnel diode semiconductor junctions is the use of poly-crystalline silicon on one side of the junction. Diffusion of the heavy concentrations of dopant is inhibited into and out from poly-crystalline silicon layer 106 compared to the diffusion demonstrated by mono-crystalline silicon. Consequently, a more abrupt semiconductor junction results and a robust tunneling phenomenon is demonstrated.

While the features which result from the inclusion of thin natural oxide layer 105 are desirable, in alternate embodiments they may be omitted by substantially omitting layer 105 at the junctions of tunnel diodes 32, 52 and 57.

Figure 11:
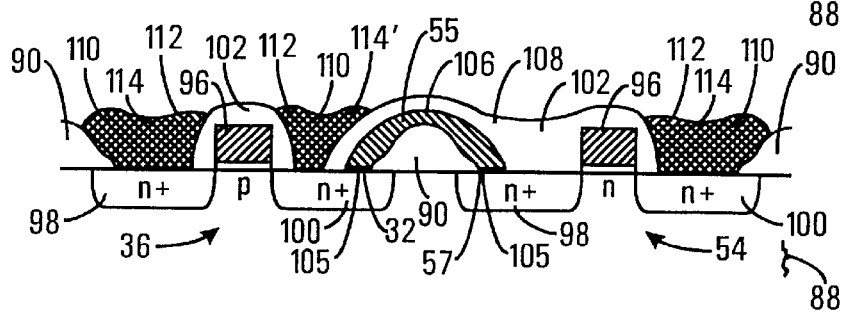
FIG. 11 shows a cross sectional schematic view of the selected portion of the memory cell during a sixth manufacturing stage.

FIG. 11 illustrates a sixth stage which follows the tunnel diode and poly-interconnect formation stage discussed above in connection with FIG. 10. In this sixth stage, a dielectric layer 108 is deposited over the structure of FIG. 10, then vias 110 are formed, and a subsequent metallization layer 112 is deposited. Metallization layer 112 is then etched as necessary into traces 114 which interconnect components of the electronic circuit. For example, a trace 114' which couples to drain 100 of drive transistor 36 and to the cathode of tunnel diode 32 is extended to pass transistor 42, a gate of load transistor 54, and a gate of the drive transistor 36 in the other circuit chain, as indicated in the schematic diagram of FIG. 2. While FIG. 11 does not show a metal or other connection to gates 96 of transistors 36 and 54, those skilled in the art will appreciate that such connections would be represented above or below the sheet of paper which depicts the FIG. 11 cross section. As discussed above, since interconnection 55 is formed in poly-crystalline silicon layer 106, interconnection 55 does not compete with traces 114 for precious space. Memory cell 30 is smaller at least in part because trace 114', for example, need not observe a minimum metal-to-metal spacing with interconnect 55.

Following the metallization stage discussed above in connection with FIG. 11, the electronic circuit may be finished using conventional processes.

In summary, the present invention provides an improved electronic semiconductor circuit that includes a tunnel diode. In one embodiment, a static memory cell is provided which uses a tunnel diode in the memory cell load. A static memory cell or other electronic circuit that includes a tunnel diode is implemented in a small area due in part to the extensive use of a single type of transistor (e.g., NMOS), is a high speed switching device due in part to exploitation of the tunneling phenomenon, and consumes only a little power due in part to high speed switching. In one embodiment a static memory cell or other electronic circuit includes a tunnel diode formed by a junction between a mono-crystalline silicon layer and a poly-crystalline silicon layer. The tunnel diode may be formed so that the electronic circuit requires no additional semiconductor die area due in part to fabrication on associated transistor sources and drains and due in part to the use of a poly-crystalline silicon interconnect which does not require expanded contact areas and does not compete with metal traces for precious trace-routing space.

The present invention has been described above with reference to preferred embodiments. However, those skilled in the art will recognize that changes and modifications may be made in these preferred embodiments without departing from the scope of the present invention. These and other changes and modifications which are obvious to those skilled in the art are intended to be included within the scope of the present invention.

What is claimed is:

1. A static memory cell comprising:
   a drive transistor having an input/output (I/O) port;
   a load transistor having a controlled port; and
   a tunnel diode coupled in series between said controlled port of said load transistor and said I/O port of said drive transistor, said tunnel diode being formed on said I/O port of said drive transistor.

2. A static memory cell as claimed in claim 1 wherein:
   said I/O port of said drive transistor is formed in a region of a mono-crystalline silicon layer doped with an impurity of a first conductivity type; and said tunnel diode is formed at a junction of said region between said mono-crystalline silicon layer and a poly-crystalline silicon layer, said poly-crystalline silicon layer being doped with an impurity of a second conductivity type.

3. A static memory cell as claimed in claim 2 wherein:

said junction has a layer of an insulating material between said mono-crystalline silicon layer and said poly-crystalline silicon layer.

4. A static memory cell as claimed in claim 3 wherein said insulating material is $SiO_2$.

5. A static memory cell as claimed in claim 3 wherein said insulating material is less than 25 Å thick.

6. A static memory cell as claimed in claim 1 additionally comprising a non-metallic, conductive interconnect region formed between said tunnel diode and said controlled port of said load transistor.

7. A static memory cell as claimed in claim 6 wherein:

said tunnel diode is a first tunnel diode, said first tunnel diode being forward biased; and said static memory cell additionally comprises a second tunnel diode coupled in series between said controlled port of said load transistor and said I/O port of said drive transistor, said second tunnel diode being reverse biased.

8. A static memory cell as claimed in claim 7 wherein:

said controlled port of said load transistor and said I/O port of said drive transistor are respectively formed in first and second regions of a mono-crystalline silicon layer;

said first and second tunnel diodes are respectively formed at junctions of said first and second regions between said mono-crystalline silicon layer and a poly-crystalline silicon layer; and said poly-crystalline silicon layer provides said non-metallic interconnect region.

9. A static memory cell as claimed in claim 1 wherein:

said drive transistor comprises an N channel metal oxide semiconductor (NMOS) field effect transistor (FET) configured to operate in an enhancement mode; and said load transistor comprises an NMOS FET configured to operate in a depletion mode.

10. A static memory cell comprising:

a drive transistor having an input/output (I/O) port formed in a first region of a mono-crystalline silicon layer;

a load transistor having a controlled port formed in a second region of said mono-crystalline silicon layer; and a conductive poly-crystalline silicon interconnect formed between said first and second regions of said mono-crystalline silicon layer, said poly-crystalline silicon interconnect being configured to form a forward biased tunnel diode at a junction between said interconnect and said mono-crystalline silicon layer.

11. A static memory cell as claimed in claim 10 wherein said tunnel diode is formed on said I/O port of said drive transistor.

12. A static memory cell as claimed in claim 10 wherein said junction has a layer of an insulating material between said mono-crystalline silicon layer and said poly-crystalline silicon interconnect.

13. A static memory cell as claimed in claim 10 wherein:

said tunnel diode is a first tunnel diode; and said conductive poly-crystalline silicon interconnect is further configured so that a second tunnel diode is formed between said poly-crystalline silicon interconnect and said mono-crystalline silicon layer, said second tunnel diode being reverse biased.

14. A static memory cell as claimed in claim 13 wherein said first tunnel diode is formed at said I/O port of said drive transistor and said second tunnel diode is formed at said controlled port of said load transistor.

15. A static memory cell as claimed in claim 10 wherein:

said drive transistor comprises an N channel metal oxide semiconductor (NMOS) field effect transistor (FET) configured to operate in an enhancement mode; and said load transistor comprises an NMOS FET configured to operate in a depletion mode.

16. An electronic semiconductor circuit which includes a tunnel diode, said circuit comprising:

a mono-crystalline silicon layer doped with an impurity of a first conductivity type; and a poly-crystalline silicon layer overlying said mono-crystalline silicon layer, said poly-crystalline silicon layer being doped with an impurity of a second conductivity type;

wherein effective concentrations of said first conductivity type and said second conductivity type dopants are respectively included in said mono-crystalline and poly-crystalline silicon layers so that tunneling results.

17. An electronic semiconductor circuit which includes a tunnel diode as claimed in claim 16 additionally comprising a layer of an insulating material between said mono-crystalline silicon layer and said poly-crystalline silicon layer.

18. An electronic semiconductor circuit which includes a tunnel diode as claimed in claim 17 wherein said insulating material is $SiO_2$.

19. An electronic semiconductor circuit which includes a tunnel diode as claimed in claim 17 wherein said insulating material is less than 25 Å thick.

20. An electronic semiconductor circuit which includes a tunnel diode as claimed in claim 16 wherein:

said mono-crystalline silicon layer includes first and second regions doped with said impurity of said first conductivity type, said first and second regions being spaced apart by a third region of said mono-crystalline silicon layer, said third region exhibiting substantially less conductivity than said first and second regions; and said poly-crystalline silicon layer extends between said first and second regions, electrically interconnects said first and second regions, forms a forward biased tunnel diode at said first region, and forms a reverse biased tunnel diode at said second region.

21. An electronic semiconductor circuit which includes a tunnel diode as claimed in claim 16 wherein:

said first region is a port of a first transistor; and said second region is a port of a second transistor.

22. An electronic semiconductor circuit which includes a tunnel diode as claimed in claim 21 wherein:

said first transistor is configured as a drive transistor of a memory cell; and said second transistor is configured as a load transistor of said memory cell.

* * * * *